(12) United States Patent
Yu et al.

(10) Patent No.: US 7,105,928 B2
(45) Date of Patent: Sep. 12, 2006

(54) COPPER WIRING WITH HIGH TEMPERATURE SUPERCONDUCTOR (HTS) LAYER

(75) Inventors: Chen-Hua Yu, Hsin-Chu (TW);
Horng-Huei Tseng, Hsin-Chu (TW);
Chenming Hu, Hsin-Chu (TW);
Chao-Hsiung Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 202 days.

(21) Appl. No.: 10/684,224

(22) Filed: Oct. 10, 2003

(65) Prior Publication Data

US 2005/0077627 A1 Apr. 14, 2005

(51) Int. Cl.
*H01L 23/52* (2006.01)

(52) U.S. Cl. ............... 257/774; 257/E23.167; 257/663; 257/758; 257/700; 257/701; 257/759; 257/760; 257/764; 257/762; 257/766; 257/298; 257/664; 257/751

(58) Field of Classification Search ............... 257/700, 257/701, 758, 759, 760, 764, 762, 766, 298, 257/664, 663, 665, 751, 774, E23.167
See application file for complete search history.

(56) References Cited

U.S. PATENT DOCUMENTS

| 5,629,268 | A | 5/1997 | Tanaka et al. |
| 6,420,189 | B1 * | 7/2002 | Lopatin .................. 438/2 |
| 6,518,648 | B1 | 2/2003 | Lopatin |
| 6,541,136 | B1 | 4/2003 | Kwon et al. |
| 6,642,539 | B1 * | 11/2003 | Ramesh et al. ............... 257/43 |
| 6,667,231 | B1 * | 12/2003 | Wu ........................ 438/628 |
| 2002/0155675 | A1 * | 10/2002 | Hartner et al. ............. 438/393 |

* cited by examiner

*Primary Examiner*—Alexander Oscar Williams
(74) *Attorney, Agent, or Firm*—Slater & Matsil, L.L.P.

(57) ABSTRACT

Semiconductor devices and methods of forming the semiconductor devices using an HTS (High Temperature Superconductor) layer in combination with a typical diffusion layer between the dielectric material and the copper (or other metal) conductive wiring. The HTS layer includes a superconductor material comprised of barium copper oxide and a rare earth element. The rare earth element yttrium is particularly suitable. For semiconductor devices having other semiconductor circuits or elements above the wiring, a capping layer of HTS material is deposited over the wiring before a cover layer of dielectric is deposited.

51 Claims, 2 Drawing Sheets

COPPER WIRING WITH HIGH TEMPERATURE SUPERCONDUCTOR (HTS) LAYER

TECHNICAL FIELD

The present invention relates generally to the use of diffusion barrier layers and capping layers with conductors formed by a damascene etch scheme, and more particularly to the use of an HTS (High Temperature Superconductor) layer in trenches, vias or other apertures having a width of less than 300 Å. One suitable HTS is yttrium barium copper oxide.

BACKGROUND

As is well known by those skilled in the art, a continuing goal in manufacturing and production of semiconductors is a reduction in size of components and circuits with the concurrent result of an increase in the number of circuits and/or circuit elements such as transistors, capacitors, etc., on a single semiconductor device. This relentless and successful reduction in size of the circuit elements has also required reduction in the size of the conductive lines connecting devices and circuits. However, as the conducting lines are designed to be smaller and smaller, the resistance of the interconnects increases.

In the past, aluminum was used as the metal interconnect lines and silicon oxide as the dielectric. However, newer manufacturing techniques now favor copper as the metal for interconnect lines and various low-k materials (organic and inorganic) are favored as the dielectric material. Not surprisingly, these material changes have required changes in the processing methods. In particular, because of the difficulty of etching copper without also causing unacceptable damage to the dielectric material, the technique of forming the metal interconnect lines has experienced significant changes. Namely, whereas aluminum interconnects could be formed by depositing a layer of aluminum and then using photoresist, lithography, and etching to leave a desired pattern of aluminum lines, the formation of copper interconnect lines are typically formed by a process now commonly referred to as a damascene or dual damascene process. The damascene process is almost the reverse of etching, and simply stated, an aperture such as a trench, canal or via is cut, etched or otherwise formed in the underlying dielectric and is then filled with metal (i.e., copper).

Unfortunately, although copper has the advantages discussed above, it readily diffuses into dielectric material used in the manufacture of semiconductor devices. Diffusion of copper into the dielectric materials of a semiconductor deice can cause serious reliability problems including electrical shorts. Therefore, it is typical to form a diffusion barrier layer between the copper used for conductors and leads and the dielectric material of a semiconductor device. Typical barrier layers may be formed of refractory metals and nitrides of these metals. Some examples of prior art barrier layers include Ta (tantalum), TaN (tantalum nitride), Ti (titanium), TiN (titanium nitride) and various combinations of these metals as well as other metal. The diffusion barrier layer is typically formed on the bottom and sidewalls of the trenches and vias of the copper interconnects to prevent the copper from diffusing into the surrounding silicon dioxide as other dielectric material. In addition, according to the prior art a capping layer of a suitable material, such as silicon nitride, could be deposited as a cover layer over the complete structure including the conductor areas and the dielectric layer before another layer or level of dielectric structure was deposited.

Unfortunately, the traditional diffusion barrier materials have poor adhesion to copper and may peel away thereby creating poor interface properties including a path for copper to diffuse into the subsequent or cover layer of dielectric material. The same path may also allow moisture and contaminants to diffuse from outside into the copper so as to form porous copper oxide. In addition, these barrier materials also create high electrical resistance at small geometries such as below 300 Å.

U.S. Pat. No. 6,541,136 issued to Kwan, et al. and entitled "Superconducting Structure" discusses superconducting structures that include "rare earth-barium-copper oxide, and especially yttrium-barrier-copper oxide."

U.S. Pat. No. 5,629,268 issued to Tanaka, et al., and entitled "Process for Preparing a Layered Superconducting Structure" also discusses the preparation of a layered superconducting structure based on material that includes barium copper oxide combined with rare earth elements including yttrium.

U.S. Pat. No. 6,518,648 issued to Lopatin and entitled Superconductor Barrier Layer for Integrated Circuit Interconnects provides an integrated circuit that includes a high temperature semiconductor material such as yttrium barium copper oxide as a barrier layer.

SUMMARY OF THE INVENTION

These and other problems are generally solved or circumvented, and technical advantages are generally achieved, by the present invention which discloses methods and apparatus for forming a semiconductor structure comprising a first dielectric layer that defines apertures such as trenches, vias and the like, filled with copper using the dual damascene process to form metal interconnect lines separated by nonconductive regions of the dielectric.

Prior to forming the copper wiring in the aperture or trenches, and according to one embodiment, a barrier layer of one or more of a refractory metal such as titanium, tantalum or tungsten and nitrides of these metals, is used to form a conformal film over the sidewalls and bottom of the aperture and/or trenches. A layer of an HTS that may include, for example, a rare earth barrier copper oxide, such as yttrium barium copper oxide is then deposited or formed over the barrier layer. A conductive metal such as one or more of copper, copper alloy, gold, silver and compounds of these metals is then deposited over the HTS layer and will function as the wiring or interconnects in a semiconductor device.

According to another embodiment, the wiring may be covered by an HTS capping layer followed by another dielectric layer.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
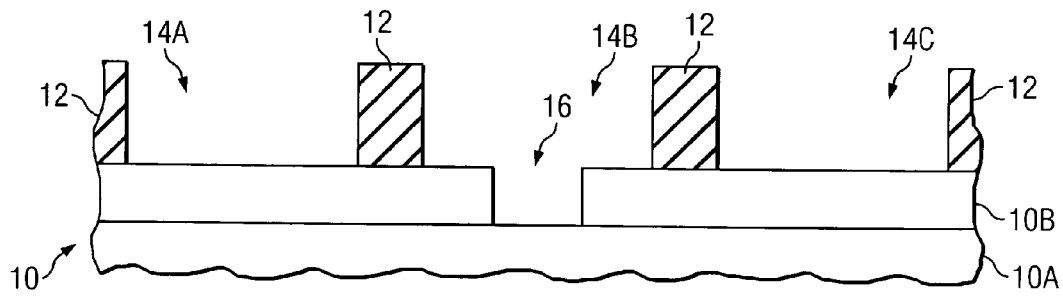
FIGS. 1–6 illustrate the method steps and resulting apparatus of the semiconductor device of the present invention.

Referring now to FIG. 1, there is shown a typical semiconductor structure including a substrate 10 formed of one or more layers such as layers 10a and 10b. Substrate 10 is covered by a first layer 12 of dielectric materials, which has been patterned to define one or more apertures, trenches or vias. As illustrated in the example of FIG. 1, there are three trenches 14a, 14b and 14c that have been prepared for filing with copper or other conductive metal according to the damascene process. It should be noted that trench 14b also includes a via 16 that extends through substrate layer 10b in a manner well known to those skilled in the art. It should be appreciated that the term substrate 10 as used herein may simply be a single silicon wafer layer or alternately may represent one or more layers of various semiconductor devices including other interconnecting metallization layers. Thus, the term substrate is intended to be broadly interpreted. For example, typically the substrate 10 may be comprised of other dielectric layers similar to the dielectric layer 12. Dielectric layer 12 may be any suitable dielectric material including a low-k dielectric material.

Figure 2:
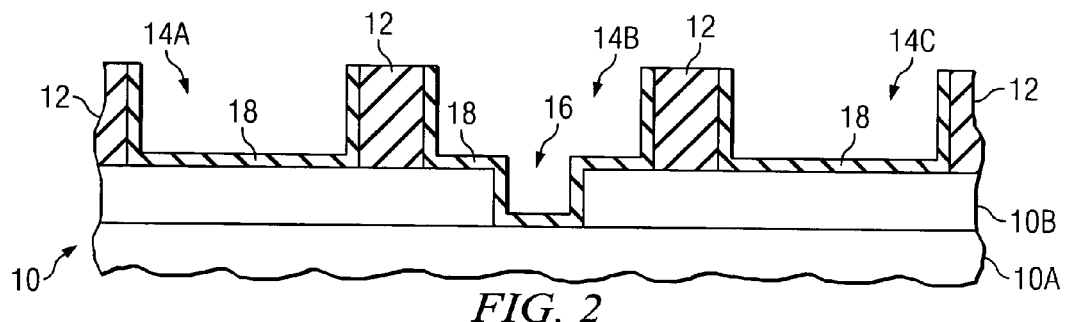

As is well known by those skilled in the art, the use of the damascene process and the use of copper as the interconnecting layers has solved many problems while at the same time creating other problems. For example, when the conducting or interconnecting lines are made of copper, the copper may diffuse into the surrounding dielectric areas if steps are not taken to prevent such diffusion. Thus, as shown in FIG. 2 there is also included a conformal barrier layer 18, which is intended to stop or hinder the diffusion of the copper ions from the copper interconnecting wiring into the surrounding non-conductive portions or regions 12 and the substrate 10. The thin conformal barrier layer 18 may be selected from various ones of the prior art barrier layer materials well known in the art. Suitable materials include, for example only, Ta (tantalum), TaN (tantalum nitride), Ti (titanium), TiN (titanium nitride) W (tungsten), WN (tungsten nitride) and various combinations of these and other materials. Barrier layer 18 may be deposited by any one of various suitable techniques well known by those skilled in the art.

Figure 3:
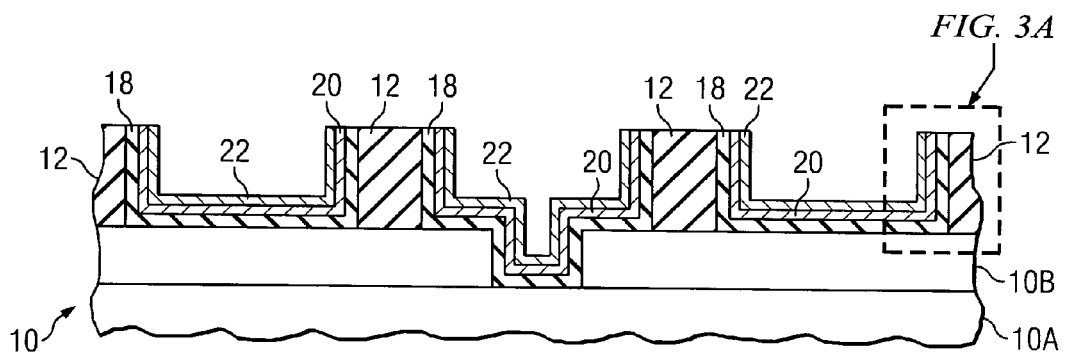
Figure 3A:
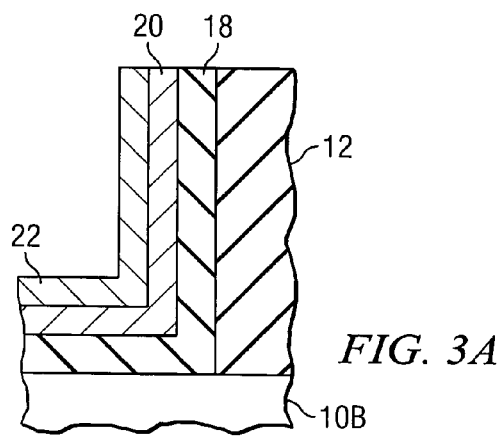

A conformal HTS (High Temperature Superconductor) layer 20 is then formed or deposited over barrier layer 18 as shown in FIG. 3. The HTS layer 20 will typically have a thickness of between about 10 Å and 500 Å. As shown in FIG. 3A, the HTS layer 20 is a type 2 category of superconductors of metallic compounds and alloys, such as for example only, superconducting "cuprates" (copper oxides) transition to the superconducting state at high critical temperatures "Tc" even at ambient pressures. For example $Hg_{0.8}Tl_{0.2}Ba_2Ca_2Cu_3O_{8.33}$ has a Tc or critical temperature of 138K.

Use of the rare earth element yttrium combined with barium copper oxide (such as $YBa_2Cu_3O_{7+}$ or $Y_2Ba_4Cu_7O_{15}$) is especially effective, although other "rare earth" elements that may be combined with barium copper oxide to form superconductors include samarium, neodymium, erbium, gadolinium, ytterbium, dysprosium, holmium and luletium. Still other alloy formulas combined with rare earth elements are also believed to be suitable. Another alloy, for example only, is "rare earth" ruthenium oxocuprate such as $RuSr_x$ (a rare earth element) $Cu_yO_z$, where x is between about 1.55 and 2.45, y is between about 1.55 and 2.45 and z is between about 7.55 and 8.45.

The layer 20 of high temperature superconductive material is then typically covered by a top layer 22 of tantalum. Thus, it is seen that the diffusion barrier layer further comprises an HTS layer, such as for example only, a "rare earth" barium copper oxide sandwiched between a bottom layer of tantalum or a tantalum-rich nitride 18 and a top layer 22 of tantalum.

Figure 4:
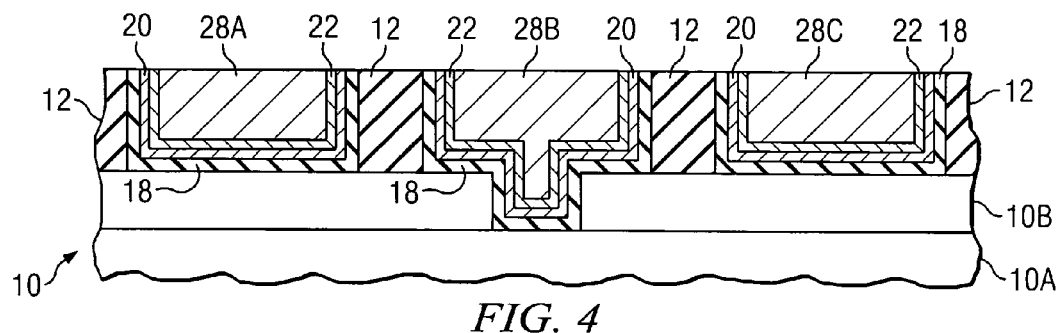

A conductive metal, such as copper, is then deposited to fill the trenches, vias, and/or apertures so as to form the semiconductor wiring and/or interconnects 28a, 28b and 28c as shown in FIG. 4. As was mentioned above, the prior art diffusion barrier layer of metal nitride materials exhibited poor adhesion to copper and often resulted in high electrical resistance when used with small geometric apertures. The HTS layer 20 of this invention has better adhesion and exhibits much lower electrical resistance for apertures, trenches or vias having a width less than 300 Å.

Figure 5:
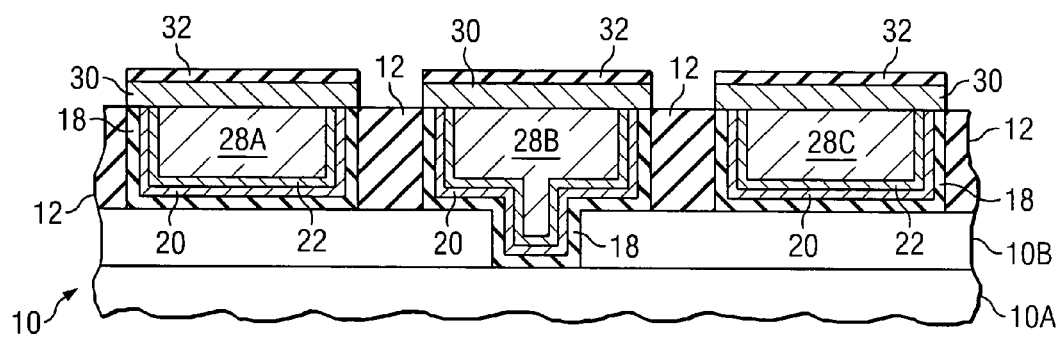

In many applications, it is also desirable to provide a cover or capping layer 30 over the conductive material regions 28a, 28b and 28c as shown in FIG. 5. Although cover layer 30 may be added for all applications, the cover layer 30 is especially important if still another layer of semiconductor devices is to be formed over the conductive wiring 28a, 28b and 28c. Unfortunately, as was discussed above, the typical prior art metal nitride layers do not adhere well to the copper interconnect lines which may have been subjected to CMP. Further, the conductive layer such as a layer of copper may include rough areas. Thus, because of the poor adhesion qualities between the copper and the prior art protective cover layer of a metal nitride, it was not uncommon for serious reliability problems to occur. For example, the layer of metal nitride would often peel away leaving no barrier between the copper and a second dielectric layer. Of course as will be appreciated by those skilled in the art, when the barrier of metal nitride is absent, the copper ions will readily diffuse into the second layer of a dielectric thereby often causing electrical shorts.

Therefore, referring again to FIG. 5, the cover layer 30, according to the present invention, does not use the typical metal nitride cover layer but instead is an HTS capping layer. The HTS capping layer 30 is formed in the same manner as the HTS layer 20 discussed above and will typically be deposited to a thickness of between about 10 Å and 500 Å. The HTS capping layer 30 typically covers only the wiring 28a, 28b and 28c by the use of a patterned hard mask 32 such as an Anti-Reflecting Coating (ARC) as also shown in FIG. 5. Although the hard mask or ARC 32 could be removed if required for further processing, it may not be necessary to do so.

Figure 6:
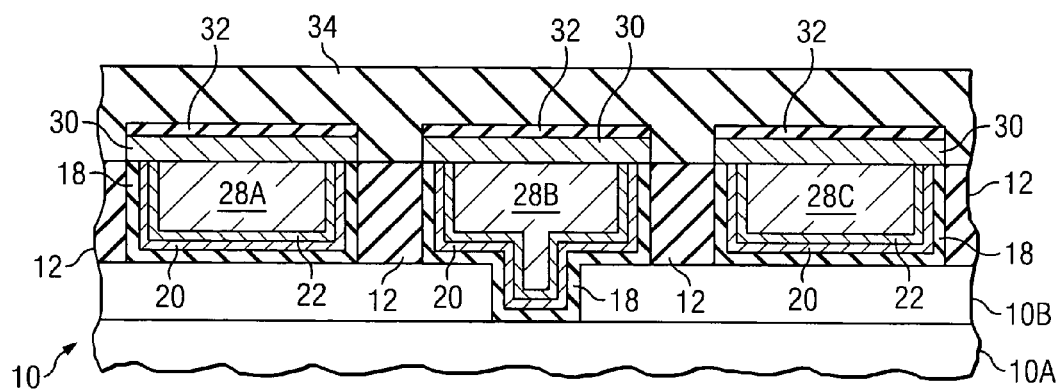

After the patterned HTS capping layer 30 is formed over the conductive wiring 28a, 28b and 28c, a second layer 34 of dielectric is deposited as shown in FIG. 6 such that other levels of the semiconductor device may be fabricated. The second layer 34 of dielectric material may be any suitable dielectric including low-k dielectric materials.

Although the present invention and its advantages have been described in detail, it should be understood that various changes, substitutions and alterations can be made herein without departing from the spirit and scope of the invention as defined by the appended claims. For example, it will be readily understood by those skilled in the art that dimensions and layer thickness may be varied while remaining within the scope of the present invention.

Moreover, the scope of the present application is not intended to be limited to the particular embodiments of the process, methods and steps described in the specification. As one of ordinary skill in the art will readily appreciate from the disclosure of the present invention, processes, methods, or steps, presently existing or later to be developed, that perform substantially the same function or achieve substantially the same result as the corresponding embodiments described herein may be utilized according to the present invention. Accordingly, the appended claims are intended to include within their scope such processes, methods, or steps.

What is claimed is:

1. Connecting metalization for use in a semiconductor device comprising:
   a dielectric layer defining at least one aperture therein;
   a barrier layer formed along the bottom and side walls of said at least one aperture;
   a high temperature superconductor (HTS) layer formed over and coating the barrier layer in said at least one aperture;
   a tantalum layer in direct contact with and covering said HTS layer; and
   a conductive material in direct contact with said tantalum layer and filling said aperture in said dielectric layer to form said connecting metalization.

2. The semiconductor device of claim 1 wherein the dielectric layer is a low-k dielectric material.

3. The semiconductor device of claim 1 wherein the barrier layer is a material selected from a group consisting of titanium, titanium nitride, tantalum, tantulum nitride, tungsten, tungsten nitride, and alloys and combinations of these materials.

4. The semiconductor device of claim 1 wherein the HTS material is a rare earth cuprate (copper oxide) material.

5. The semiconductor device of claim 1 wherein the HTS material is a rare earth element combined with barium copper oxide.

6. The semiconductor device of claim 5 wherein said rare earth element is selected from the group consisting of yttrium, samarium, neodymium, erbium, gadolinium, ytterbium, dysprosium, holmium and lutetium.

7. The semiconductor device of claim 5 wherein the HTS material is yttrium barium copper oxide.

8. The semiconductor device of claim 1 wherein said HTS layer is a rare earth Ruthenium Oxocuprate.

9. The semiconductor device of claim 8 wherein said rare earth Ruthenium Oxocuprate is defined by the formula $RuSr_x$ (rare earth element) $Cu_yO_z$ in which x is between about 1.55 and 2.45, y is between about 1.55 and 2.45, and z is between about 7.55 and 8.45.

10. The semiconductor device of claim 9 wherein said rare earth element is selected from the group consisting of yttrium, samarium, neodymium, erbium, gadolinium, ytterbium, dysprosium, holmium and lutetium.

11. The semiconductor device of claim 1 wherein the HTS layer has a thickness of between 10 Å to 500 Å.

12. The semiconductor device of claim 1 wherein the conductive material is comprised of a material selected from a group consisting of copper, copper alloy, gold, silver, and compounds and combinations thereof.

13. The semiconductor device of claim 1 wherein the aperture defined in said dielectric has a width less than about 300 Å.

14. The semiconductor device of claim 1 wherein said at least one aperture includes at least two trenches.

15. The semiconductor device of claim 14 wherein one of said at least two trenches further includes a via.

16. The semiconductor device of claim 1 further comprising a capping layer over said conductive metal filling said at least one aperture.

17. The semiconductor device of claim 16 wherein said capping layer is an HTS capping layer.

18. The semiconductor device of claim 16 further comprising another dielectric layer over said first dielectric layer and said HTS capping layer.

19. The semiconductor device of claim 16 further including a hard mask over said HTS capping layer.

20. The semiconductor device of claim 19 wherein said hard mask is a layer of ARC.

21. The semiconductor device of claim 18 wherein said HTS capping layer has a thickness between about 10 Å and 500 Å.

22. Connecting metalization for use in a semiconductor device comprising:
   a first dielectric layer defining at least one aperture therein;
   a barrier layer formed along the bottom and side walls of said at least one aperture;
   a high temperature superconductor (HTS) layer formed over and coating said barrier layer;
   a tantalum layer in direct contact with and covering said HTS layer;
   a conductive material filling said at least one aperture in said first dielectric layer;
   an HTS capping layer over said conductive material filling said at least one aperture; and
   another dielectric layer over said first dielectric layer and said HTS capping layer.

23. The semiconductor device of claim 22 wherein said HTS capping layer has a thickness of between about 10 Å and 500 Å.

24. The semiconductor device of claim 22 wherein said aperture in said first dielectric layer has a width less than about 300 Å.

25. The semiconductor device of claim 22 wherein the HTS material is a rare earth cuprate (copper oxide) material.

26. The semiconductor device of claim 22 wherein the HTS material is a rare earth element combined with barium copper oxide.

27. The semiconductor device of claim 26 wherein said rare earth element is selected from the group consisting of yttrium, samarium, neodymium, erbium, gadolinium, ytterbium, dysprosium, holmium and lutetium.

28. The semiconductor device of claim 26 wherein the HTS material is yttrium barium copper oxide.

29. Connecting metalization for use in a semiconductor device comprising:
   a dielectric layer defining at least one aperture therein;
   a barrier layer formed along the bottom and side walls of said at least one aperture;
   a high temperature superconductor (HTS) layer formed over and coating the barrier layer in said at least one aperture said HTS layer being a different material and distinct from said barrier layer; and
   a conductive material in direct contact with said HTS layer and filling said aperture in said dielectric layer to form said connecting metalization.

30. The semiconductor device of claim 29 wherein the dielectric layer is a low-k dielectric material.

31. The semiconductor device of claim 29 wherein the barrier layer is a material selected from a group consisting of titanium, titanium nitride, tantalum, tantulum nitride, tungsten, tungsten nitride, and alloys and combinations of these materials.

32. The semiconductor device of claim 29 wherein the HTS material is a rare earth cuprate (copper oxide) material.

33. The semiconductor device of claim 29 wherein the HTS material is a rare earth element combined with barium copper oxide.

34. The semiconductor device of claim 33 wherein said rare earth element is selected from the group consisting of yttrium, samarium, neodymium, erbium, gadolinium, ytterbium, dysprosium, holmium and lutetium.

35. The semiconductor device of claim 33 wherein the HTS material is yttrium barium copper oxide.

36. The semiconductor device of claim 29 wherein said HTS layer is a rare earth Ruthenium Oxocuprate.

37. The semiconductor device of claim 36 wherein said rare earth Ruthenium Oxocuprate is defined by the formula $RuSr_x$ (rare earth clement) $Cu_yO_z$ in which x is between about 1.55 and 2.45, y is between about 1.55 and 2.45, and z is between about 7.55 and 8.45.

38. The semiconductor device of claim 37 wherein said rare earth element is selected from the group consisting of yttrium, samarium, neodymium, erbium, gadolinium, ytterbium, dysprosium, holmium and lutetium.

39. The semiconductor device of claim 29 wherein the HTS layer has a thickness of between 10 Å to 500 Å.

40. The semiconductor device of claim 29 wherein the conductive material is comprised of a material selected from a group consisting of copper, copper alloy, gold, silver, and compounds and combinations thereof.

41. The semiconductor device of claim 29 wherein the aperture defined in said dielectric has a width less than about 300 Å.

42. The semiconductor device of claim 29 wherein said at least one aperture includes at least two trenches.

43. The semiconductor device of claim 29 further comprising a capping layer over said conductive metal filling said at least one aperture.

44. The semiconductor device of claim 43 wherein said capping layer is an HTS capping layer.

45. The semiconductor device of claim 43 further comprising another dielectric layer over said first dielectric layer and said HTS capping layer.

46. The semiconductor device of claim 44 further including a hard mask over said HTS capping layer.

47. The semiconductor device of claim 46 wherein said hard mask is a layer of ARC.

48. Connecting metalization for use in a semiconductor device comprising:
   a first dielectric layer defining at least one aperture therein;
   a barrier layer formed along the bottom and side walls of said at least one aperture;
   a high temperature superconductor (HTS) layer formed over and coating said barrier layer;
   a conductive material in direct contact with said HTS layer and filling said at least one aperture in said first dielectric layer to form said connecting metalization;
   an HTS capping layer over said conductive material filling said at least one aperture; and
   another dielectric layer over said first dielectric layer and said HTS capping layer.

49. The semiconductor device of claim 48 wherein the HTS material is a rare earth cuprate (copper oxide) material.

50. The semiconductor device of claim 48 wherein the HTS material is a rare earth element combined with barium copper oxide.

51. The semiconductor device of claim 50 wherein said rare earth element is selected from the group consisting of yttrium, samarium, neodymium, erbium, gadolinium, ytterbium, dysprosium, holmium and lutetium.

* * * * *